(12) United States Patent
Nagatomo

(10) Patent No.: US 8,102,004 B2
(45) Date of Patent: Jan. 24, 2012

(54) SEMICONDUCTOR DEVICE AND MANUFACTURING METHOD THEREOF

(75) Inventor: Koji Nagatomo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 579 days.

(21) Appl. No.: 12/255,276

(22) Filed: Oct. 21, 2008

(65) Prior Publication Data

US 2009/0101982 A1    Apr. 23, 2009

(30) Foreign Application Priority Data

Oct. 22, 2007 (JP) ................. 2007-274118

(51) Int. Cl.
*H01L 27/088* (2006.01)
*H01L 21/8234* (2006.01)

(52) U.S. Cl. ........................................ 257/368

(58) Field of Classification Search ................. 257/351, 257/722, 192, 194, 368, E27.06, E21.616, 257/223, 227, 291, 292, 439, 443, 655, E27.1, 257/E27.125, E27.112, E29.117, E29.145, 257/E29.147, E29.151, E29.182, E29.202, 257/E29.273–E29.299, E29.314, E29.32, 257/E23.016, 66, 72, E29.003; 438/149, 438/163

See application file for complete search history.

(56) References Cited

U.S. PATENT DOCUMENTS

| | | | |
|---|---|---|---|
| 6,855,990 B2 | 2/2005 | Yeo et al. | |
| 7,164,183 B2 | 1/2007 | Sakaguchi et al. | |
| 7,176,520 B2 * | 2/2007 | Miyake et al. | 257/327 |
| 7,307,273 B2 | 12/2007 | Currie | |
| 7,319,254 B2 * | 1/2008 | Kwak et al. | 257/305 |
| 7,545,001 B2 * | 6/2009 | Cheng et al. | 257/357 |
| 7,611,938 B2 * | 11/2009 | Cheng et al. | 438/199 |
| 7,859,064 B1 * | 12/2010 | Oh et al. | 257/401 |
| 2004/0099903 A1 * | 5/2004 | Yeo et al. | 257/317 |
| 2006/0284255 A1 * | 12/2006 | Shin et al. | 257/351 |
| 2007/0108471 A1 * | 5/2007 | Oishi | 257/192 |
| 2008/0157224 A1 * | 7/2008 | Fischer et al. | 257/401 |
| 2008/0303068 A1 * | 12/2008 | Grill et al. | 257/288 |
| 2009/0184424 A1 * | 7/2009 | Furusawa et al. | 257/758 |

FOREIGN PATENT DOCUMENTS

JP    2006-351975       12/2006
WO   WO 2004/090992 A1  10/2004

OTHER PUBLICATIONS

Kyongsub Shin, et al., "Dual Stress Capping Layer Enhancement Study for Hybrid Orientation FinFET CMOS Technology" IEEE 2005, 4 pages.

* cited by examiner

*Primary Examiner* — Dao H Nguyen
*Assistant Examiner* — Tram H Nguyen
(74) *Attorney, Agent, or Firm* — Oblon, Spivak, McClelland, Maier & Neustadt, L.L.P.

(57) ABSTRACT

A semiconductor device according to an embodiment of the present invention comprises: a semiconductor substrate; a first field-effect transistor formed on the semiconductor substrate, and including a fin constituted by a semiconductor layer having source and drain regions via a channel region in an extending direction, and a gate electrode formed on the channel region via an insulating film; a stress application layer formed on a top surface of the gate electrode, and formed by a conductive material of which a difference between linear expansion coefficients at a temperature of forming a stress application layer and a room temperature is different from a difference between linear expansion coefficients of the fin at the temperature of forming the stress application layer and the room temperature, and a plug layer formed on the stress application layer and above the fin, and made of a conductive material having larger Young's modulus than that of the fin.

15 Claims, 11 Drawing Sheets

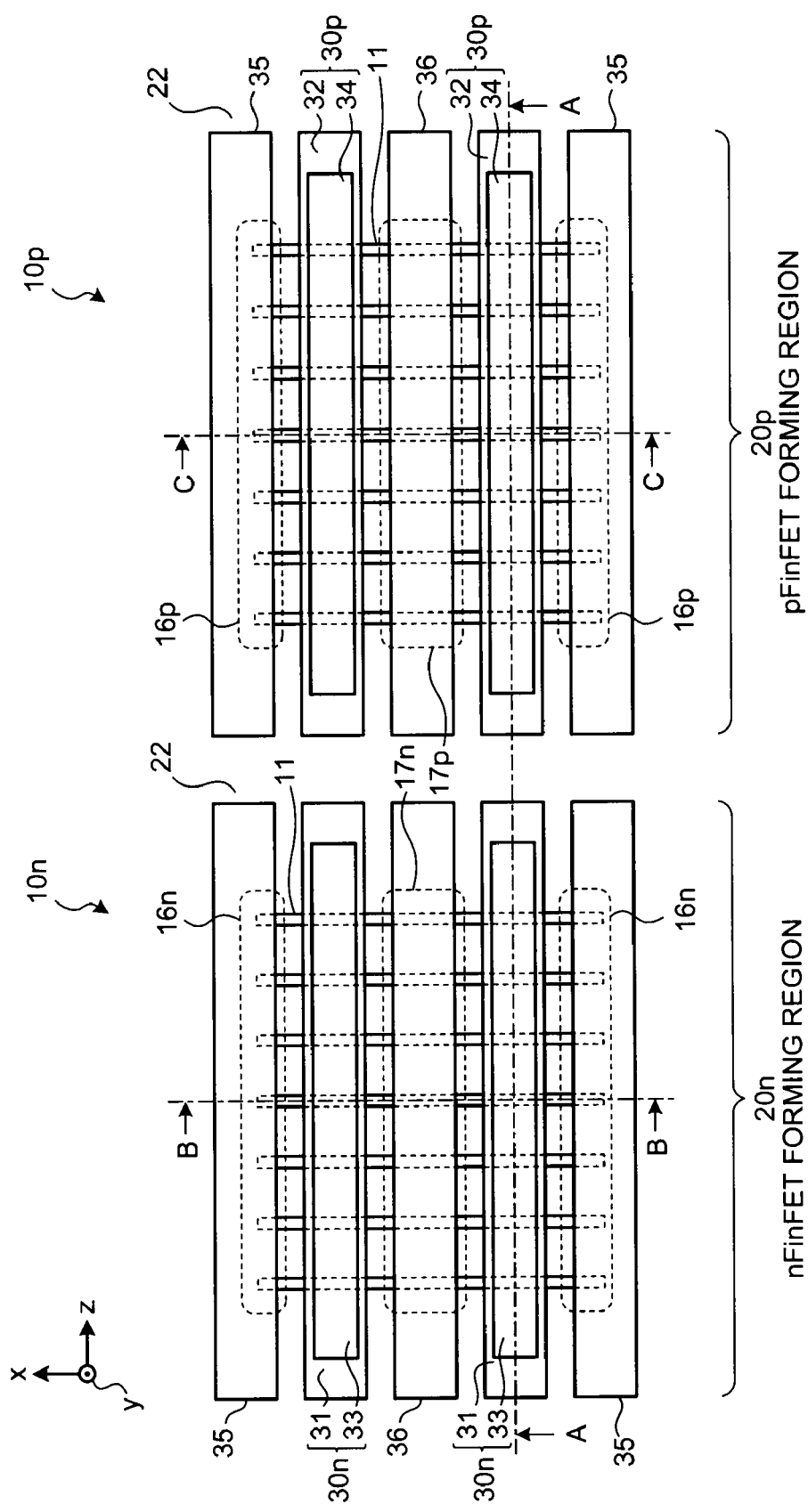

FIG.3

REFERENCE: CHRONOLOGICAL SCIENTIFIC TABLES (1993)

| | LINEAR EXPANSION COEFFICIENT α [1/K] @293K | LINEAR EXPANSION COEFFICIENT α [1/K] @500K | α @500K-α @293K | SPECIFIC RESISTANCE ρ [ohm/m] @273K | SPECIFIC RESISTANCE ρ [ohm/m] @373K |
|---|---|---|---|---|---|
| Bi | 13.4 | 12.7 | -0.7 | 107.0 | 156.0 |
| W | 4.5 | 4.6 | 0.1 | 4.9 | 7.3 |
| Ta | 6.3 | 6.8 | 0.5 | 12.3 | 16.7 |
| Sb | 11.0 | 11.7 | 0.7 | 39.0 | 59.0 |
| Pt | 8.8 | 9.6 | 0.8 | 9.8 | 13.6 |
| Ir | 6.4 | 7.2 | 0.8 | 4.7 | 6.8 |
| Si | 2.6 | 3.5 | 0.9 | | |
| Rh | 8.2 | 9.3 | 1.1 | 4.3 | 6.2 |
| Au | 14.2 | 15.4 | 1.2 | 2.1 | 2.9 |
| C | 1.0 | 2.3 | 1.3 | | |
| Ti | 8.6 | 9.9 | 1.3 | | |
| Pd | 11.8 | 13.2 | 1.4 | 10.0 | 13.8 |
| V | 8.4 | 9.9 | 1.5 | | |
| Ag | 18.9 | 20.6 | 1.7 | 1.5 | 2.1 |
| Cu | 16.5 | 18.3 | 1.8 | 1.6 | 2.2 |
| Ni | 13.4 | 15.3 | 1.9 | 6.2 | 10.3 |
| Co | 13.0 | 15.0 | 2.0 | 5.6 | 9.5 |
| Zn | 30.2 | 32.8 | 2.6 | 5.5 | 7.8 |
| Fe | 11.8 | 14.4 | 2.6 | 8.9 | 14.7 |
| Al | 23.1 | 26.4 | 3.3 | 2.5 | 3.6 |
| Cr | 4.9 | 8.8 | 3.9 | 12.7 | 16.1 |
| Mg | 24.8 | 29.1 | 4.3 | 3.9 | 5.6 |
| Pb | 28.9 | 33.3 | 4.4 | 19.2 | 27.0 |
| Sn | 22.0 | 27.2 | 5.2 | 11.5 | 15.8 |
| Cd | 30.8 | 36.0 | 5.2 | 6.8 | 9.8 |

# SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2007-274118, filed on Oct. 22, 2007; the entire contents of which are incorporated herein by reference.

BACKGROUND OF THE INVENTION

In a field-effect transistor using a fin structure for a channel (hereinafter, "FinFET"), a technique of applying stress to the channel has been known as a method of improving carrier mobility in the channel. For example, in Japanese Patent Application Laid-open No. 2006-351975, an insulating film covers between fins laid out in parallel and the upper part of the fins, to apply compressive stress to a direction perpendicular to a height direction of the fins, thereby improving current driving force, by utilizing a phenomenon that an insulating film works in a direction to contract. In International publication WO 2004/090992, a gate electrode is formed on an upper surface and on a side surface of fins made of silicon, and an interlayer film having a linear expansion coefficient smaller than that of silicon is formed on this gate electrode. With this arrangement, tensile strain is applied to a direction perpendicular to a height direction of the fins, thereby improving mobility. As explained above, according to the techniques of Japanese Patent Application Laid-open No. 2006-351975 and WO2004/090992, an insulating film is formed on a side surface and on an upper surface of fins on which a gate electrode is laid out, thereby applying stress to mainly a direction perpendicular to a height direction of the fins.

According to the FinFET, when more stress is applied to a channel region of the fins, carrier mobility of the channel is improved more. Therefore, there has been desired a technique capable of applying more stress to the fins of the FinFET in the structure shown in techniques of Japanese Patent Application Laid-open No. 2006-351975 and WO2004/090992. It has been conventionally known that, in the FinFET, when stress is applied to a height direction of the fins, carrier mobility can be improved most effectively in the channel (for example, see Kyoung sub Shin, et al., "Dual Stress Capping Layer Enhancement Study for Hybrid Orientation FinFET CMOS Technology", 2005 IEEE). However, in the techniques of Japanese Patent Application Laid-open No. 2006-351975 and WO2004/090992, because stress is applied to a direction perpendicular to the height direction of the fins, this has not been effective to improve carrier mobility in the channel of the FinFET.

SUMMARY OF THE INVENTION

A semiconductor device according to an embodiment of the present invention comprises: a semiconductor substrate; a first field-effect transistor formed on the semiconductor substrate, and including a fin constituted by a semiconductor layer having source and drain regions via a channel region in an extending direction, and a gate electrode formed on the channel region via an insulating film; a stress application layer formed on a top surface of the gate electrode, and formed by a conductive material of which a difference between linear expansion coefficients at a temperature of forming a stress application layer and a room temperature is different from a difference between linear expansion coefficients of the fin at the temperature of forming the stress application layer and the room temperature, and a plug layer formed on the stress application layer and above the fin, and made of a conductive material having larger Young's modulus than that of the fin.

A semiconductor device according to an embodiment of the present invention comprises: a semiconductor substrate; a first field-effect transistor formed on the semiconductor substrate, and including a fin constituted by a semiconductor layer having source and drain regions via a channel region in an extending direction, and a gate electrode formed on the channel region via an insulating film; a stress application layer formed on a top surface of the gate electrode, and made of a silicide film that applies stress to the fin in a height direction, and a plug layer formed on the stress application layer and above the fin, and made of a conductive material having larger Young's modulus than that of the fin.

A method of manufacturing a semiconductor device according to an embodiment of the present invention comprises: forming a gate insulating film and a gate electrode on a semiconductor substrate on which fin is formed, sequentially; patterning a laminated film of the gate insulating film and the gate electrode to leave a region on the fin corresponding to a region forming a channel; forming source and drain regions of a predetermined conductive type on the fin at both sides of the laminated film along an extending direction of the fin, using the laminated film as a mask; forming an interlayer insulating film on the semiconductor substrate on which the fin is formed; forming an opening to form a gate plug at a forming position of the gate electrode formed at an upper part of the fin; forming a stress application layer formed by a conductive material of which a difference between linear expansion coefficients at a temperature of forming a stress application layer and a room temperature is different from a difference between linear expansion coefficients of the fin at a temperature of forming the stress application layer and the room temperature, within the opening; and forming a plug layer made of a conductive material having larger Young's modulus than that of the fin, on the stress application layer within the opening.

BRIEF DESCRIPTION OF THE DRAWINGS

FIG. 1 is a schematic plan view showing one example of a semiconductor device according to a first embodiment of the present invention;

FIG. 3 depicts values of linear expansion coefficients and specific resistances of metal materials;

DETAILED DESCRIPTION OF THE PREFERRED EMBODIMENTS

Exemplary embodiments of a semiconductor device and a manufacturing method thereof according to the present invention will be explained below in detail with reference to the accompanying drawings. The present invention is not limited thereto. Further, the drawings of the semiconductor device are schematic, and a relationship between a thickness and a width of a layer, and a ratio of thicknesses of the layers are different from actual relationship and ratios.

Figure 2A:
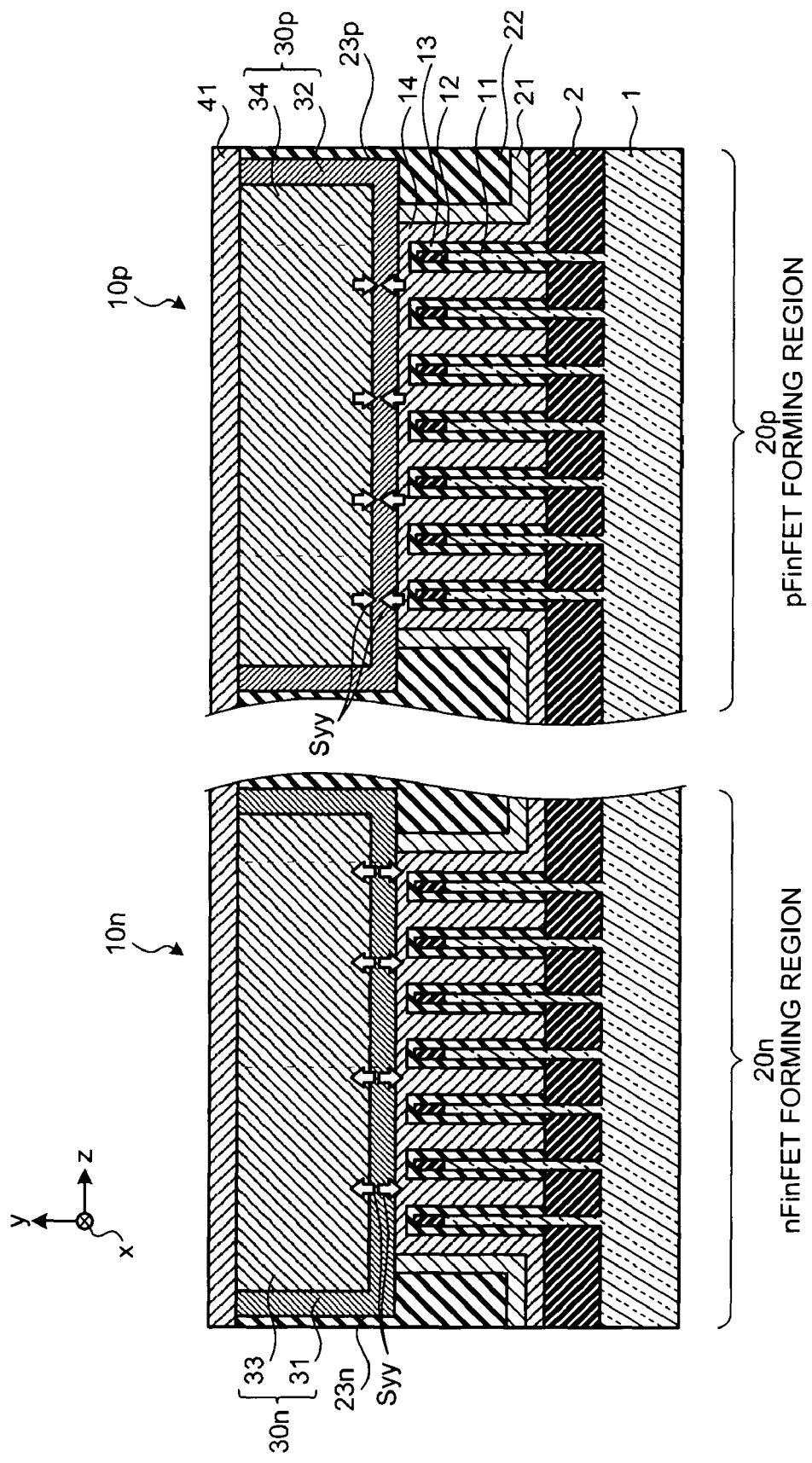
FIG. 2A is a cross-sectional view along a line A-A in FIG. 1.
Figure 2B:
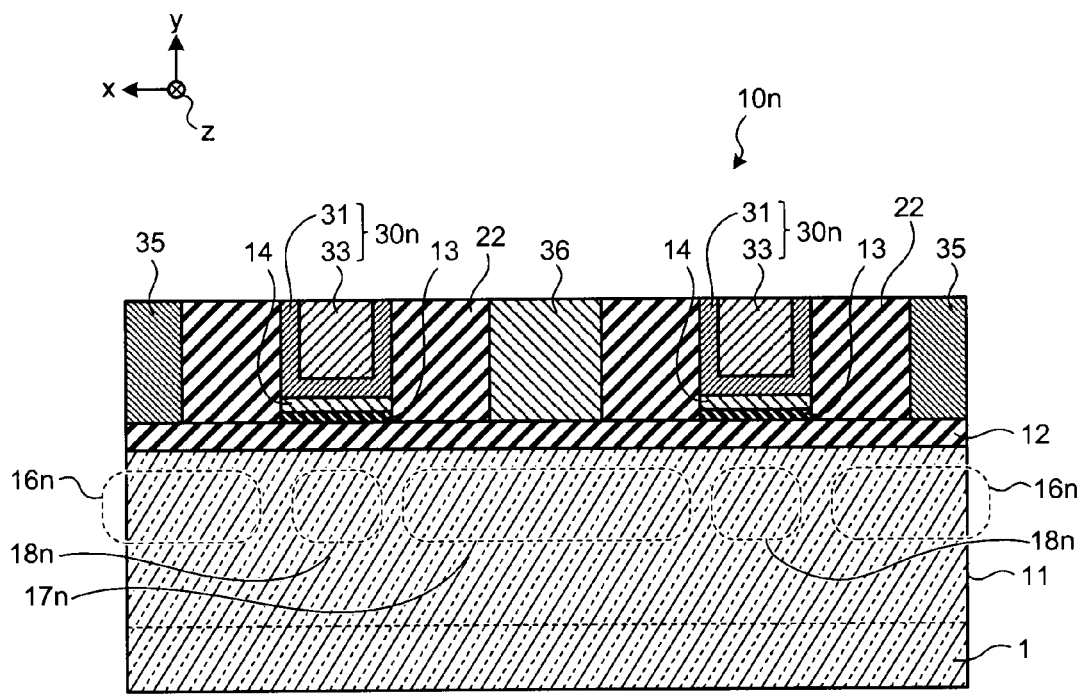
FIG. 2B is a cross-sectional view along a line B-B in FIG. 1.
Figure 2C:
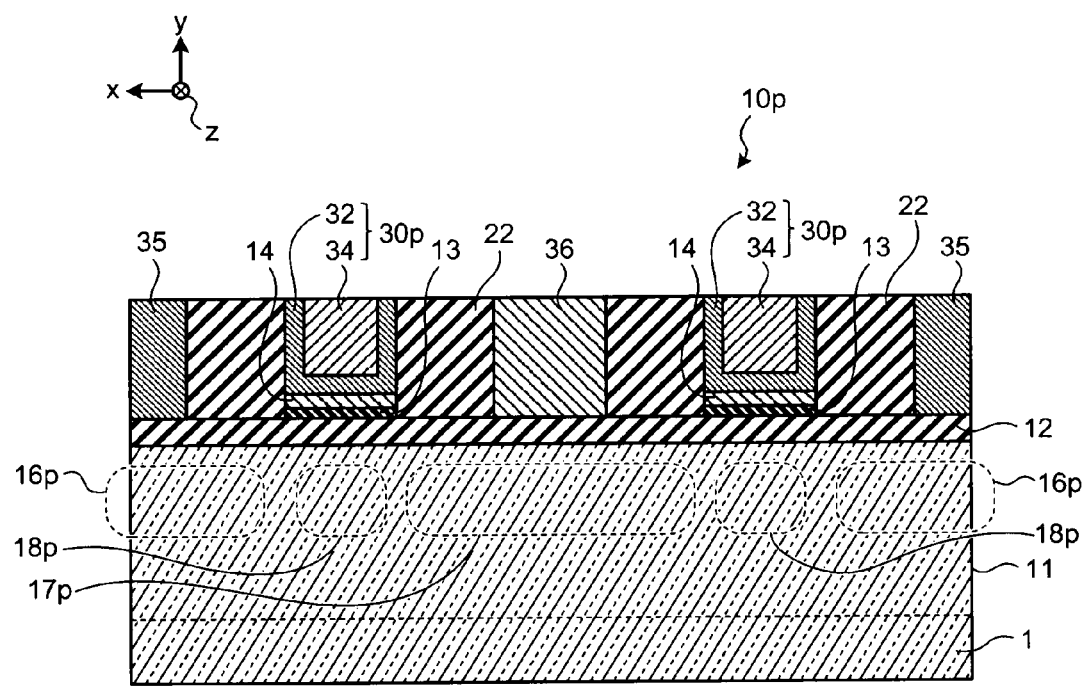
FIG. 2C is a cross-sectional view along a line C-C in FIG. 1.

FIG. 1 is a schematic plan view showing one example of a semiconductor device according to a first embodiment of the present invention. FIG. 2A is a cross-sectional view along a line A-A in FIG. 1. FIG. 2B is a cross-sectional view along a line B-B in FIG. 1. FIG. 2C is a cross-sectional view along a line C-C in FIG. 1. In the first embodiment, a complementary metal oxide semiconductor (CMOS) device is explained, having an n-channel FinFET (hereinafter, "nFinFET") $10n$ and a p-channel FinFET (hereinafter, "pFinFET") $10p$ formed on one silicon substrate 1. Each of FinFETs $10n$ and $10p$ has a FinFET structure, having gate electrodes, source regions, and drain regions of plural fins 11 connected to each other by common wirings (plugs). That is, in FIG. 1 and FIG. 2A, a part shown by the nFinFET $10n$ has a role of one field-effect transistor (FET), and a part shown by the pFinFET $10p$ has a role of one FET.

According to this FinFET, the nFinFET $10n$ and the pFinFET $10p$ are formed on an nFinFET forming region $20n$ and a pFinFET forming region $20p$, respectively on the substrate 1 as a semiconductor substrate. A predetermined number of fins 11 constituting a channel are formed at predetermined intervals, on the silicon substrate 1, and a cap film 12 made of an insulating film is formed on an upper surface of the fins 11. An element-isolation insulating film 2 electrically insulating between the adjacent fins 11 is formed at a lower part between the adjacent fins 11. A height direction of the fins 11 is set as a y-axis, a direction (an extension direction) to which a current within the fins 11 flows is set as an x-axis, and a direction (a width direction of the fins 11) perpendicular to both the y-axis and the x-axis is set as a z-axis.

A gate insulating film 13 having a thickness of about five nanometers is formed to cover the upper surface and a side surface of the fins 11 and the cap film 12. A gate electrode 14 is formed to cover the gate insulating film 13. A liner film 21 is formed on one side surface of the gate electrode 14 positioned at the outermost of the fins 11 laid out in parallel, and on an upper surface of the gate electrode 14 where no fins 11 are formed. A source region $16n$ and a drain region $17n$ formed by diffusing an n-type impurity are formed in the nFinFET $10n$, and a source region $16p$ and a drain region $17p$ formed by diffusing a p-type impurity are formed in the pFinFET $10p$, in both-side fins 11 of the gate electrode 14 along the x-axis direction of the fins 11. An interlayer insulating film 22 made of silicon oxide or the like is formed on the silicon substrate 1 on which the gate electrode 14 is formed. In the nFinFET forming region $20n$, a source plug 35 is formed to connect between the source regions $16n$ of the fins 11, on the source regions $16n$ of the fins 11. Further, in the nFinFET forming region $20n$, a drain plug 36 is formed to connect between the drain regions $17n$ of the fins 11, on the drain regions $17n$ of the fins 11. Similarly, in the pFinFET forming region $20p$, the source plug 35 is formed to connect between the source regions $16p$ of the fins 11, on the source regions $16p$ of the fins 11. Further, in the pFinFET forming region $20p$, the drain plug 36 is formed to connect between the drain regions $17p$ of the fins 11, on the drain regions $17p$ of the fins 11. While the fins 11 are formed on the silicon substrate 1 in this example, fins can be also formed on a silicon-on-insulator (SOI) substrate.

Gate plugs $30n$ and $30p$ becoming electric contacts to the gate electrode 14 and having a function of applying compressive or tensile stress to the fins 11 are formed on the upper part of the gate electrode 14, and an upper-layer wiring 41 is formed on the upper part of the gate plugs $30n$ and $30p$. The gate plugs $30n$ and $30p$ apply compressive or tensile stress Syy to the y-axis direction of the fins 11. The stress Syy is applied to the y-axis direction of the fins 11, to improve carrier mobility in the channel.

The gate plug $30n$ of the nFinFET $10n$ includes a compressive-stress application layer 31 formed on a side surface and a bottom surface within an opening (a contact hole) $23n$ formed on the gate electrode 14, and made of a conductive material to apply compressive stress to the y-axis direction of the fins 11, and a plug layer 33 made of a conductive material having larger Young's modulus than that of the material constituting the fins 11 to fill the opening $23n$ formed with the compressive-stress application layer 31. The compressive-stress application layer 31 is configured by a material of which a difference between a linear expansion coefficient at a temperature of forming the compressive-stress application layer 31 and a linear expansion coefficient at a room temperature is smaller than a difference between a linear expansion coefficient at a temperature of forming the compressive-stress application layer 31 of a material constituting the fins 11 and a linear expansion coefficient at the room temperature. That is, a material is used of which a difference between a volume at a temperature of forming the compressive-stress application layer 31 and a volume at the room temperature is smaller than a difference between a volume at a temperature of forming the compressive-stress application layer 31 of a material constituting the fins 11 and a volume at the room temperature. With this arrangement, when a temperature of forming the compressive-stress application layer 31 is lowered to the room temperature, a degree of contraction of the volume of the compressive-stress application layer 31 becomes smaller. Accordingly, compressive stress can be applied to the fins 11.

The gate plug $30p$ of the pFinFET $10p$ includes a tensile-stress application layer 32 formed on a side surface and a bottom surface within an opening $23p$ formed on the gate electrode 14, and made of a conductive material to apply tensile stress to the y-axis direction of the fins 11, and a plug layer 34 made of a conductive material having larger Young's modulus than that of the material constituting the fins 11 to fill the opening $23p$ formed with the tensile-stress application layer 32. The tensile-stress application layer 32 is configured by a material of which a difference between a linear expansion coefficient at a temperature of forming the tensile-stress application layer 32 and a linear expansion coefficient at the room temperature is larger than a difference between a linear expansion coefficient at a temperature of forming the tensile-stress application layer 32 of a material constituting the fins 11 and a linear expansion coefficient at the room temperature. That is, a material is used of which a difference between a volume at a temperature of forming the tensile-stress application layer 32 and a volume at the room temperature is larger than a difference between a volume at a temperature of forming the tensile-stress application layer 32 of a material constituting the fins 11 and a volume at the room temperature. With this arrangement, when a temperature of forming the tensile-stress application layer 32 is lowered to the room temperature, a degree of contraction of the volume of the tensile-stress application layer 32 becomes larger. Therefore, tensile stress can be applied to the fins 11.

As explained above, in the first embodiment, the gate plugs 30n and 30p having lamination structures of the stress application layers 31 and 32, and the plug layers 33 and 34 are provided on the gate electrode 14. Therefore, compressive stress (in the case of the nFinFET 10n) or tensile stress (in the case of the pFinFET 10p) corresponding to a difference between a first difference and a second difference, wherein the first difference is a difference between the linear expansion coefficients at the temperature of forming the stress application layers 31 and 32 and the room temperature, and the second difference is a difference between the linear expansion coefficients at the temperature of forming the materials constituting the fins 11 and the room temperature, can be applied from the height direction (the y-axis direction) of the fins 11. In addition to this, the plug layers 33 and 34 having larger Young's modulus than that of the material constituting the fins 11 can play the role of a lid to the stress application layers 31 and 32, and the stress application layers 31 and 32 can effectively apply stress to the fins 11 without invalidating the stress. Preferably, thicknesses of the compressive-stress application layer 31 and the tensile-stress application layer 32 are appropriately selected depending on the stress applied to the fins 11 and the materials used.

FIG. 3 depicts values of linear expansion coefficients and specific resistances of metal materials. In this example, a linear expansion coefficient is expressed as $\alpha$, and a temperature for forming the stress application layers 31 and 32 is assumed as 500 Kelvin (K). Linear expansion coefficients at temperatures 500 K and 293 K (room temperature) are shown. Differences between the linear expansion coefficient at 500 K and the linear expansion coefficient at 293 K of the metal materials are arranged in the small order. When a material constituting the fins 11 is silicon, a difference between the linear expansion coefficient of silicon at 500 K and the linear expansion coefficient of silicon at 293 K is 0.9. Therefore, a material of which a difference between these linear expansion coefficients is smaller than 0.9 can be used for the compressive-stress application layer 31, and a material of which a difference between these linear expansion coefficients is larger than 0.9 can be used for the tensile-stress application layer 32. However, in actual practice, it is preferable to use a material of which a difference between linear expansion coefficients at 500 K and 293 K is estranged from 0.9 of silicon, and specific resistance $\rho$ is smaller than 7 $\Omega$/m at 273 K and smaller than 11 $\Omega$/m at 373 K. As a result, tungsten (W) and the like are preferably used for the compressive-stress application layer 31, and magnesium (Mg), aluminum (Al), copper (Cu), and sliver (Ag) are preferably used for the tensile-stress application layer 32. While a difference between the linear expansion coefficients at 500 K and 293 K is 0.8 for the compressive-stress application layer 31, iridium (Ir) having lower specific resistance can be also used.

For the plug layers 33 and 34, a material having larger Young's modulus than the Young's modulus (the Young's modulus of silicon, 107 gigapascal (GPa)) of the material constituting the fins 11 is preferable. For example, materials such as tungsten carbide WCx (the Young's modulus of WC, 550 to 650 GPa) and carbide tantalum TaC (the Young's modulus of WC, 360 to 375 GPa) are proper.

Figure 4A:
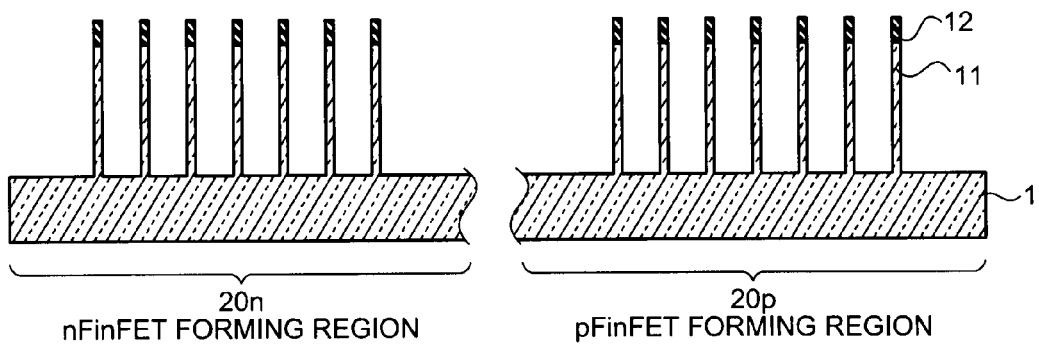
FIG. 4A to FIG. 4I are schematic cross-sectional views showing one example of a procedure of a method of manufacturing a semiconductor device according to the first embodiment.

A method of manufacturing a semiconductor device having the above structures is explained next. FIG. 4A to FIG. 4I are schematic cross-sectional views showing one example of a procedure of the method of manufacturing a semiconductor device according to the first embodiment. First, a SiN film is formed on the silicon substrate 1 as a semiconductor substrate. A mask is formed in the region where the fins 11 are manufactured by a photolithographic technique, and the SiN film is processed by reactive ion etching (RIE). As a result, the cap film 12 is formed in only the forming region of the fins 11. Thereafter, as shown in FIG. 4A, the silicon substrate 1 is etched using the cap film 12 as a mask, thereby forming a fin structure including a lamination of the fins 11 and the cap film 12.

Figure 4B:
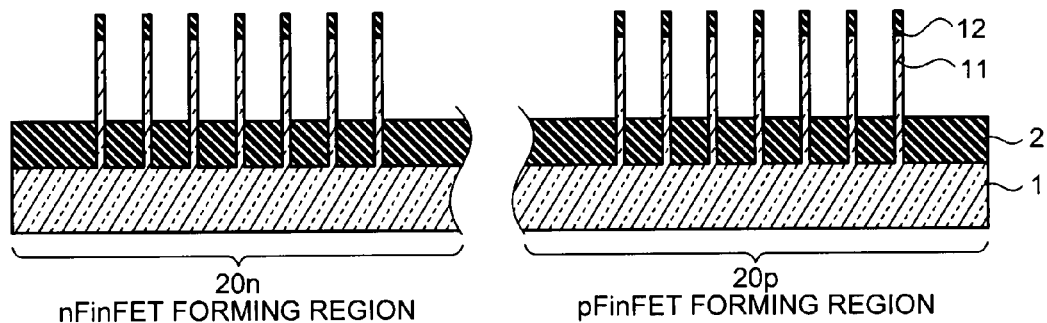

Next, as shown in FIG. 4B, a shallow trench isolation (STI) material such as a silicon oxide film is embedded into the silicon substrate 1 on which the fin structure is formed, and this is etched back, thereby forming an element-isolation insulating film 2. Thereafter, a p-type impurity such as B is ion-implanted into a channel region 18n (see FIG. 2B) of the fins 11 of the nFinFET forming regions 20n, and an n-type impurity such as P is ion-implanted into a channel region 18p (see FIG. 2C) of the fins 11 of the pFinFET forming regions 20p, and thereafter these are dispersed by heat treatment.

Figure 4C:
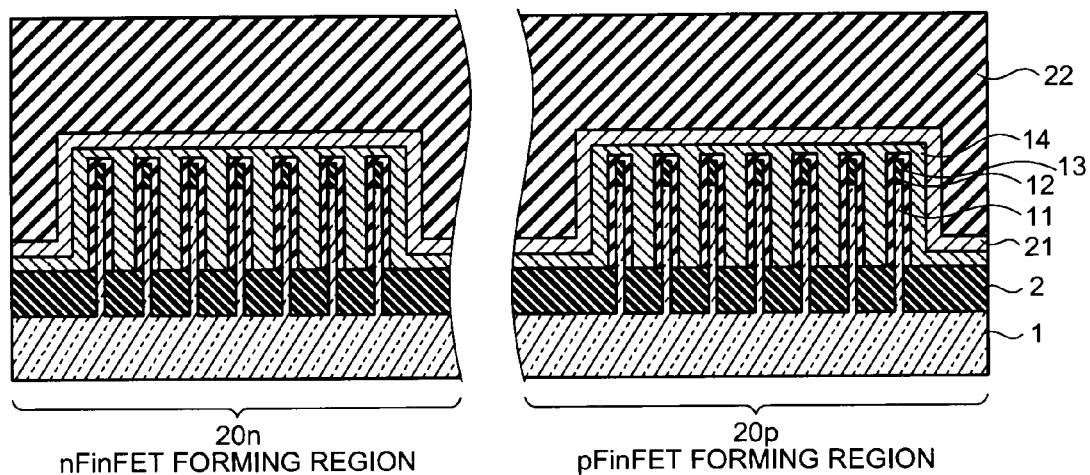

Next, as shown in FIG. 4C, the gate insulating film 13 and the gate electrode 14 are sequentially formed on the silicon substrate 1 on which the fin structure is formed. In this case, the gate electrode 14 is formed to fill between the adjacent fin structures. Thereafter, a laminated film of the gate insulating film 13 and the gate electrode 14 is patterned in a predetermined shape, by a photolithographic technique and reactive ion etching (RIE). An n-type impurity such as arsenic (As) is ion-implanted into the fins 11 at both sides of the gate electrode 14 on the nFinFET forming regions 20n, along the x-axis direction of the fins 11, using the lamination as a mask. A p-type impurity such as B is ion-implanted into the fins 11 at both sides of the gate electrode 14 on the pFinFET forming regions 20p, along the x-axis direction of the fins 11, using the lamination as a mask. The ion-implanted impurities are dispersed by heat treatment, thereby forming the source regions 16n and 16p (see FIG. 2B and FIG. 2C) and the drain regions 17n and 17p (see FIG. 2B and FIG. 2C). Thereafter, the liner film 21 and the interlayer insulating film 22 are sequentially formed on the silicon substrate 1.

Figure 4D:
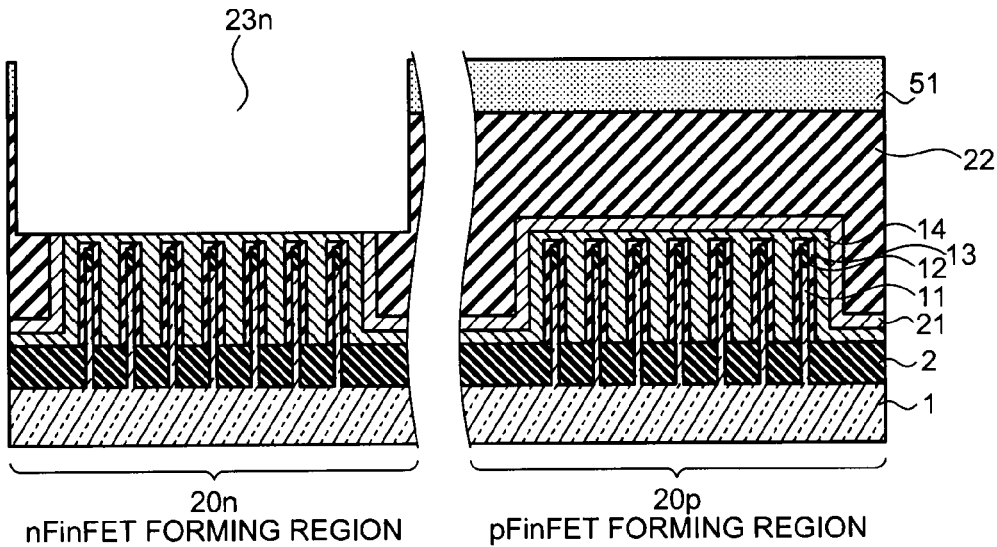

Next, as shown in FIG. 4D, a photoresist 51 is coated onto the whole surface of the interlayer insulating film 22. After this, openings to form plugs 30n, 35, and 36 are formed on the gate electrode 14, the source region 16n (see FIG. 2B), and the drain region 17n (see FIG. 2B), respectively of the nFinFET forming region 20n, using the photolithographic technique and RIE. In this example, because a cross section passing through the gate electrode 14 parallel with the extension direction of the gate electrode 14 is shown, a state of forming the opening 23n to form the gate plugs 30n is shown. In this case, the interlayer insulating film 22 is etched, using the liner film 21 as an etching stopper film, and the liner film 21 is also removed, thereby exposing the gate electrode 14.

Figure 4E:
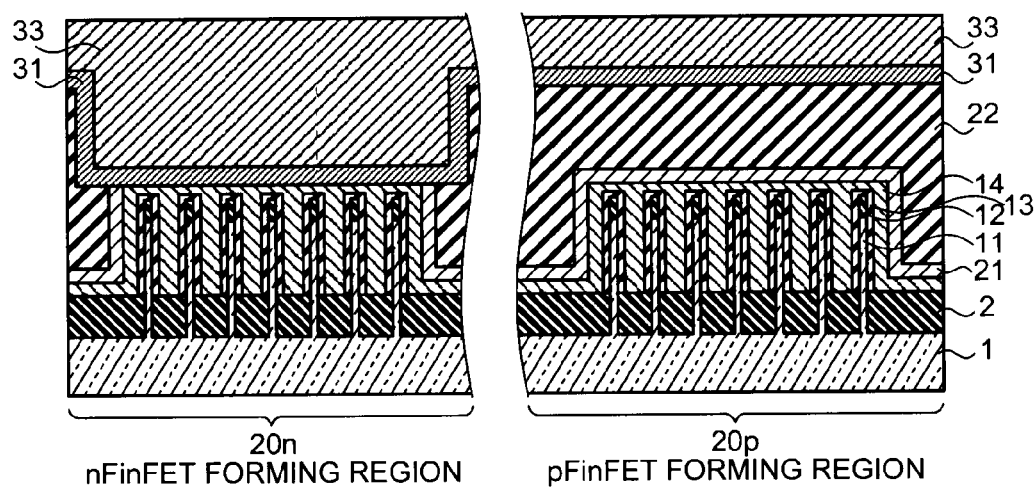

After the photoresist 51 is removed, the compressive-stress application layer 31 and the plug layer 33 are formed continuously, by setting the substrate temperature to a predetermined temperature (about a few hundred centigrade) necessary to prepare the compressive-stress application layer 31, by using a sputtering method, as shown in FIG. 4E. The compressive-stress application layer 31 is made of a material of which a difference between linear expansion coefficients at a temperature of forming the compressive-stress application layer 31 and the room temperature is smaller than a difference between linear expansion coefficients of a material constituting the fins 11 (that is silicon, in this case) at a temperature of forming the compressive-stress application layer 31 and the room temperature. And the plug layer 33 has larger Young's modulus than that of a material constituting the fins 11. The compressive-stress application layer 31 is formed to cover at least a bottom surface of the opening 23n. Thereafter, the silicon substrate 1 is cooled to near the room temperature.

In this case, immediately after the compressive-stress application layer 31 and the plug layer 33 are formed, the substrate temperature is about a few hundred centigrade as described above. However, the substrate temperature decreases along lapse of time. While each material is contracted following the decrease in the temperature, because a difference between linear expansion coefficients of the compressive-stress application layer 31 at a temperature of forming the compressive-stress application layer 31 and the room temperature is smaller than a difference between linear expansion coefficients of the material constituting the fins 11 at a temperature of forming the compressive-stress application layer 31 and room temperature, a degree of contraction of the compressive-stress application layer 31 is smaller than a degree of contraction of the material constituting the fins 11. Therefore, the material constituting the fins 11 receives stress Syy so as to be compressed in the y-axis direction by the gate plug 30n (the compressive-stress application layer 31), and compressive strain occurs in the channel region. Because the plug layer 33 has larger Young's modulus than that of the material constituting the fins 11, the plug layer 33 is not so easily deformed than the material constituting the fins 11, and has a role of a lid. As a result, loss of stress to a height direction of the fins 11 can be prevented, and compressive stress due to a volume change of the compressive-stress application layer 31 can be effectively transmitted to the fins 11.

Figure 4F:
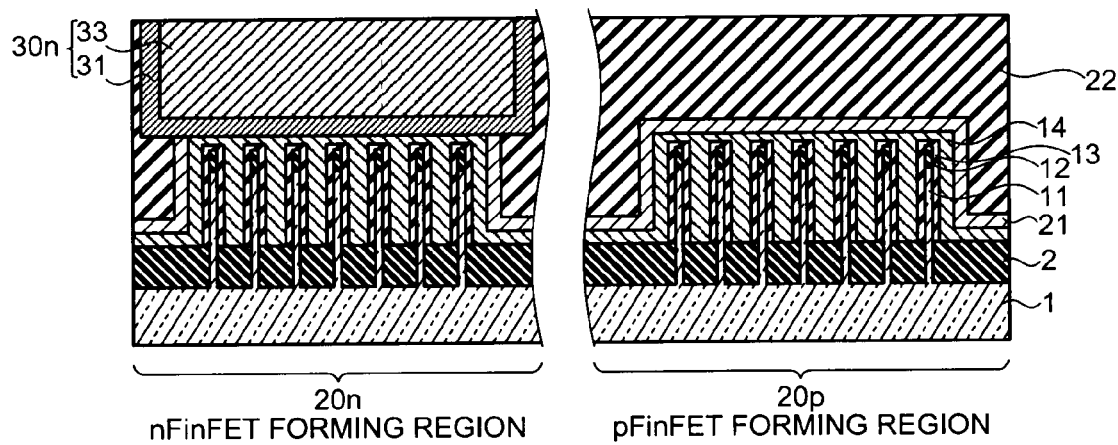
Figure 4G:
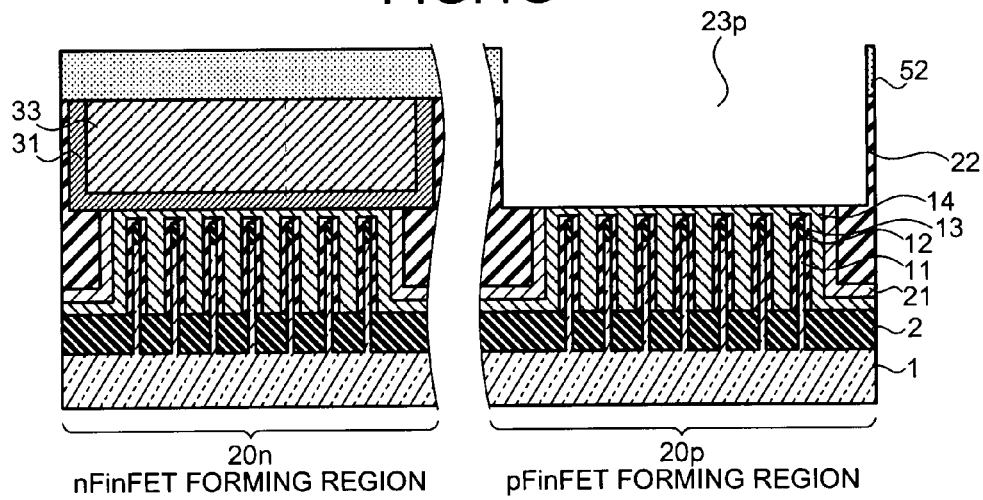

Next, as shown in FIG. 4F, the compressive-stress application layer 31 and the plug layer 33 unnecessarily formed on the interlayer insulating film 22 are removed by using chemical mechanical polishing (CMP) or the like. As a result, the gate plug 30n is formed in the opening 23n of the nFinFET 10n. Thereafter, as shown in FIG. 4G, a photoresist 52 is coated onto the whole upper surface of the interlayer insulating film 22 and the like, and openings to form the plugs 30p, 35, and 36 are formed on the gate electrode 14, the source region 16p (see FIG. 2C), and the drain region 17p (see FIG. 2C), respectively of the pFinFET forming region 20p, using the photolithographic technique and RIE. In this example, because a cross section passing through the gate electrode 14 is shown, a state of forming the opening 23p to form the gate plugs 30p is shown. In this case, the interlayer insulating film 22 is etched, using the liner film 21 as an etching stopper film, and the liner film 21 is also removed, thereby exposing the gate electrode 14.

Figure 4H:
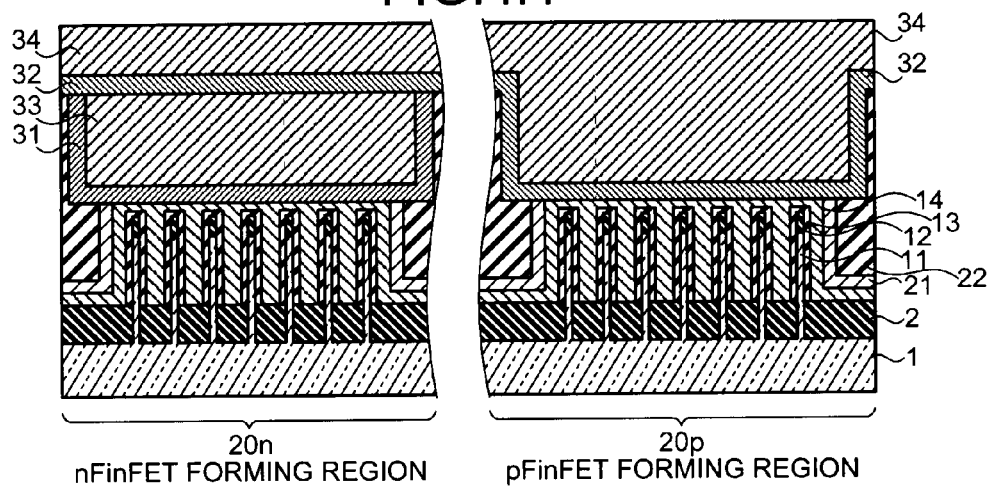

After the photoresist 52 is removed, the tensile-stress application layer 32 and the plug layer 34 are formed continuously, by setting the substrate temperature to a predetermined temperature (about a few hundred centigrade) necessary to prepare the tensile-stress application layer 32, by using a sputtering method, as shown in FIG. 4H. The tensile-stress application layer 32 is made of a material of which a difference between a linear expansion coefficients of the tensile-stress application layer 32 at a temperature of forming the tensile-stress application layer 32 and the room temperature is larger than a difference between linear expansion coefficients of a material constituting the fins 11 (that is silicon, in this case) at a temperature of forming the tensile-stress application layer 32 and the room temperature. And the plug layer 34 has larger Young's modulus than that of a material constituting the fins 11. The tensile-stress application layer 32 is formed to cover at least a bottom surface of the opening 23p. Thereafter, the silicon substrate 1 is cooled to near the room temperature.

In this case, immediately after the tensile-stress application layer 32 and the plug layer 34 are formed, the substrate temperature is about a few hundred centigrade as described above. However, the substrate temperature decreases along lapse of time. While each material is contracted following the decrease in the temperature, because a difference between linear expansion coefficients of the tensile-stress application layer 32 at a temperature of forming the tensile-stress application layer 32 and the room temperature is larger than a difference between linear expansion coefficients of a material constituting the fins 11 at a temperature of forming the tensile-stress application layer 32 and the room temperature, a degree of contraction of the tensile-stress application layer 32 is larger than a degree of contraction of the material constituting the fins 11. Therefore, the material constituting the fins 11 receives stress Syy so as to be pulled in the y-axis direction by the gate plug 30p (the tensile-stress application layer 32), and tensile strain occurs in the channel region. Because the plug layer 34 has larger Young's modulus than that of the material constituting the fins 11, the plug layer 34 is not so easily deformed than the material constituting the fins 11, and has a role of a lid. As a result, loss of stress to a height direction of the fins 11 can be prevented, and tensile stress of the tensile-stress application layer 32 can be effectively transmitted to the fins 11.

Figure 4I:
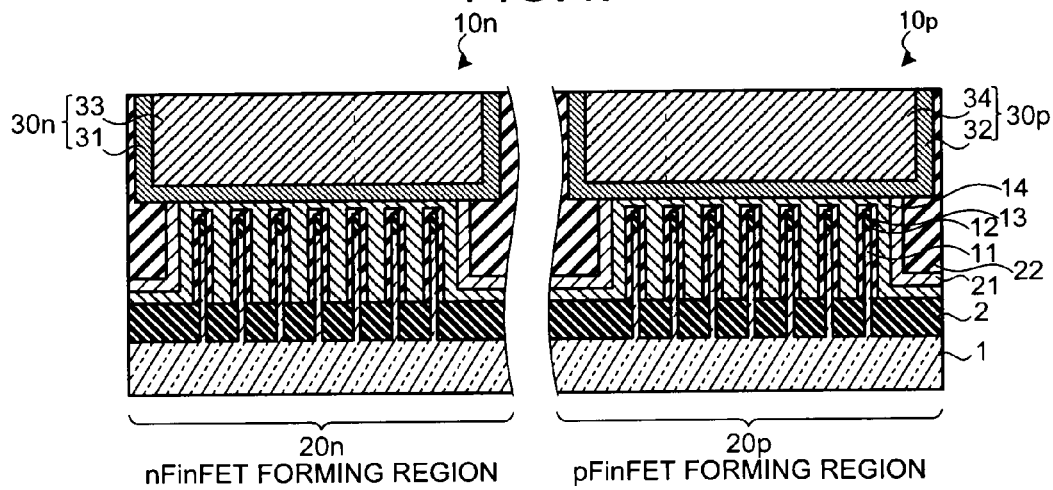

Next, as shown in FIG. 4I, the tensile-stress application layer 32 and the plug layer 34 unnecessarily formed on the interlayer insulating film 22 or the like are removed by using CMP or the like. As a result, the gate plug 30p is formed in the opening 23p of the pFinFET 10p. As a result, the nFinFET 10n is formed in the nFinFET forming region 20n, and the pFinFET 10p is formed in the pFinFET forming region 20p. By forming the upper-layer wiring 41 on the gate plug 30p, the FinFET according to the first embodiment as shown in FIG. 2A is formed.

While in the above explanations, the pFinFET 10p is formed after the nFinFET 10n is formed, the order of forming the FinFETs is not limited to this, and the nFinFET 10n can be form after the pFinFET 10p is formed. Also while in the above explanations, a CMOS device is explained as an example, the present invention can be also similarly applied to a semiconductor device constituted by the nFinFET 10n and a semiconductor device constituted by the pFinFET 10p. Also while in the above explanations, the plug layers 33 and 34 are made of a one-layer conductive material, the plug layers 33 and 34 can be also made of a plural-layer conductive material.

According to the first embodiment, on the gate electrode 14 of FinFET, there are formed the stress application layers 31 and 32, and the plug layers 33 and 34, wherein the stress application layers 31 and 32 have a difference between the linear expansion coefficients at the temperature of forming the stress application layer and the room temperature, that is different from a difference between the linear expansion coefficients of the fin configuration material at the temperature of forming the stress application layer and the room temperature, and the plug layers 33 and 34 have larger Young's modulus than that of the fin configuration material. Therefore, stress can be applied to the y-axis direction of the fins 11. As a result, carrier mobility in the channel can be improved from that of the conventional FinFET structure.

Figure 5A:
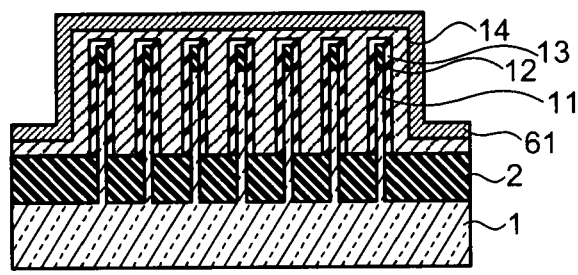
FIG. 5A to FIG. 5E are schematic cross-sectional views showing one example of a procedure of a method of manufacturing a semiconductor device according to a second embodiment of the present invention.
Figure 5B:
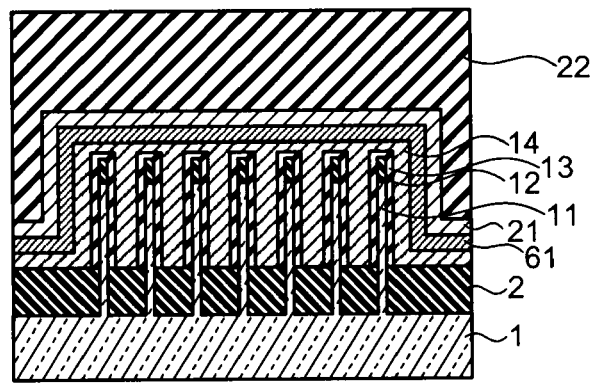
Figure 5C:
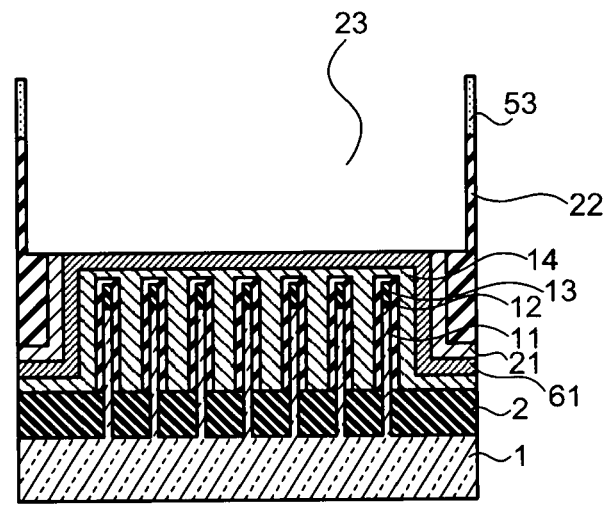
Figure 5D:
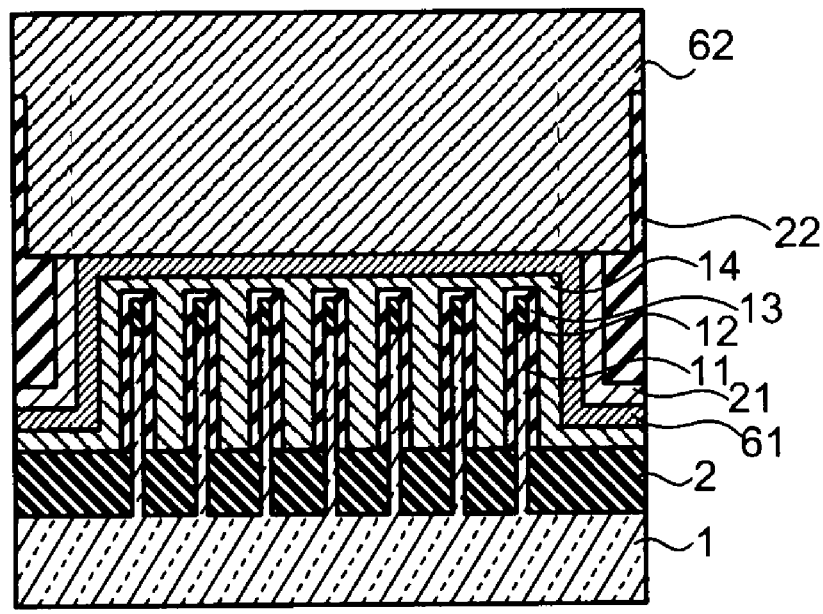
Figure 5E:
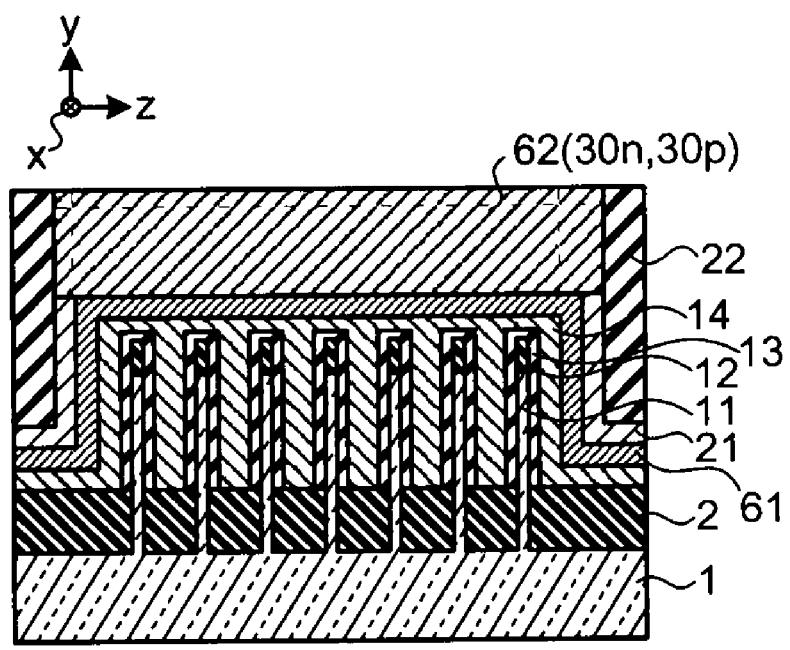

FIG. 5A to FIG. 5E are schematic cross-sectional views showing one example of a procedure of a method of manufacturing a semiconductor device according to a second embodiment of the present invention. While the stress application layers 31 and 32 are configured as a part of the gate plugs 30n and 30p, respectively in the first embodiment, a stress application layer 61 is formed in lamination on the whole upper surface of the gate electrode 14 formed on the silicon substrate 1, in a FinFET according to the second embodiment, as shown in FIG. 5E. With this arrangement, the gate electrode is apparently in a two-layer configuration. That is, the stress application layers 31 and 32 of the gate plugs 30n and 30p in the first embodiment are removed, and the stress application layer 61 is formed on the whole upper surface of the gate electrode 14 formed on the silicon substrate 1. The gate plugs 30n and 30p are formed by only a plug layer 62 made of a conductive material having larger Young's modulus than that of the configuration material of the fins 11. Constituent elements identical with those of the FinFET in the first embodiment are denoted like reference numerals, and explanations thereof will be omitted.

In the second embodiment, in the case of the nFinFET, the stress application layer 61 is also configured by a material of which a difference between linear expansion coefficients at a temperature of forming the stress application layer 61 and the room temperature is smaller than a difference between linear expansion coefficients of a material constituting the fins 11 at a temperature of forming the stress application layer 61 and the room temperature.

In the case of the pFinFET, the stress application layer 61 is configured by a material of which a difference between linear expansion coefficients at a temperature of forming the stress application layer 61 and the room temperature is larger than a difference between linear expansion coefficients of a material constituting the fins 11 at a temperature of forming the stress application layer 61 and the room temperature.

Preferably, the plug layer 62 constituting the gate plugs 30n and 30p is formed by a material having larger Young's modulus than that of the material constituting the fins 11.

The method of manufacturing a semiconductor device according to the second embodiment is explained next. As explained with reference to FIGS. 4A and 4B in the first embodiment, after a fin structure is formed on the silicon substrate 1, the element-isolation insulating film 2 is embedded into between the fin structures, and predetermined conductive ion is implanted into the region in which the channel region of the fins 11 is formed.

Next, as shown in FIG. 5A, the gate insulating film 13, the gate electrode 14, and the stress application layer 61 are formed on the silicon substrate 1 on which the fin structure is formed. In this case, the gate electrode 14 is formed to fill between the adjacent fin structures, and the stress application layer 61 is formed to cover the whole upper surface of the formed gate electrode 14. Thereafter, a laminated film of the gate insulating film 13, the gate electrode 14, and the stress application layer 16 is patterned in a predetermined shape, by the photolithographic technique and RIE. Predetermined conductive impurity is ion-implanted into both-side fins 11 of the gate electrode 14 along the x-axis direction of the fins 11 in the FinFET forming region, using the laminated film as a mask. The impurity is dissipated by heat treatment, thereby forming source and drain regions. Thereafter, as shown in FIG. 5B, the liner film 21 and the interlayer insulating film 22 are sequentially formed on the silicon substrate 1.

As shown in FIG. 5C, a photoresist 53 is coated onto the whole upper surface of the interlayer insulating film 22. After this, openings to form plugs are formed on the gate electrode 14, the source region, and the drain region of the FinFET forming region, using the photolithographic technique and RIE. In this example, because a cross section passing through the gate electrode 14 parallel with the extension direction of the gate electrode 14 is shown, a state of forming the opening 23 to form the gate plugs 30n and 30p is shown. In this case, the interlayer insulating film 22 is etched, using the liner film 21 as an etching stopper film, and the liner film 21 is also removed, thereby exposing an upper surface of the stress application layer 61.

After the photoresist 53 is removed, the plug layer 62 having larger Young's modulus than that of the material constituting the fins 11 is formed to fill the opening 23, using the sputtering method or the like, as shown in FIG. 5D. The plug layer 62 unnecessarily formed on the interlayer insulating film 22 is removed by using CMP or the like, thereby forming the FinFET shown in FIG. 5E.

In this case, in generating the CMOS device like in the first embodiment, the stress application layer 61 needs to be formed in the forms of the nFinFET and the pFinFET. However, this has an advantage in that, at the time of forming the gate plugs 30n and 30p (the plug layer 62), both the nFinFET and the pFinFET can be formed simultaneously. The gate plugs 30n and 30p (the plug layer 62) can be configured by a one-layer conductive material, or can be configured by plural-layer conductive material.

In the second embodiment, the stress application layer 61 can also apply stress to the y-axis direction of the fins 11, and the plug layer 62 can effectively apply stress to the fins 11 by the stress application layer 61. Therefore, carrier mobility in the channel can be improved more that in the conventional FinFET structure.

Figure 6A:
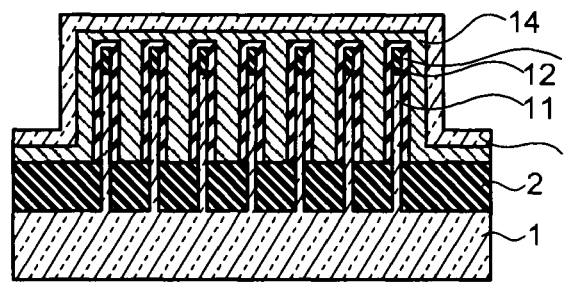
FIG. 6A to FIG. 6F are schematic cross-sectional views showing one example of a procedure of a method manufacturing a semiconductor device according to a third embodiment of the present invention.
Figure 6B:
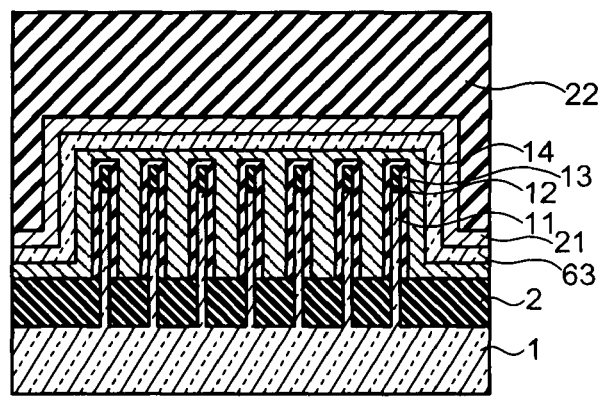
Figure 6C:
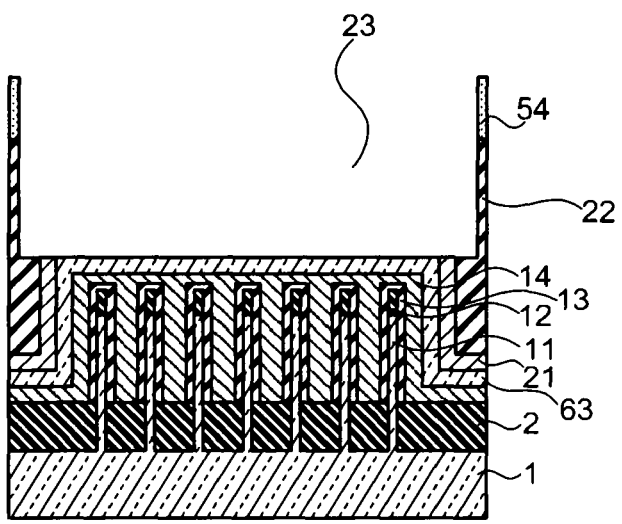
Figure 6D:
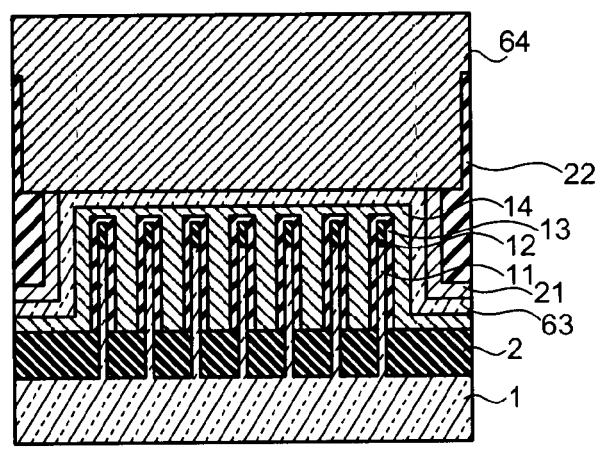
Figure 6E:
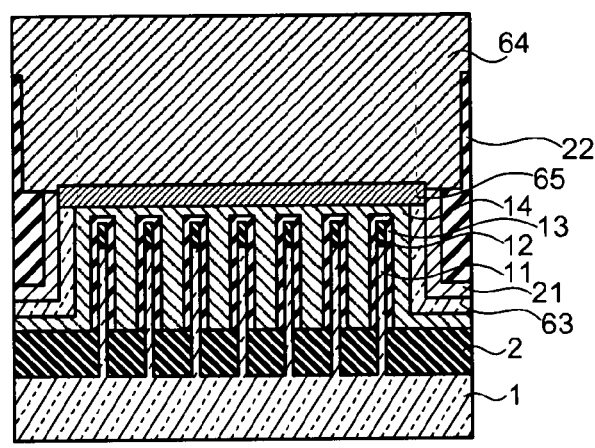
Figure 6F:
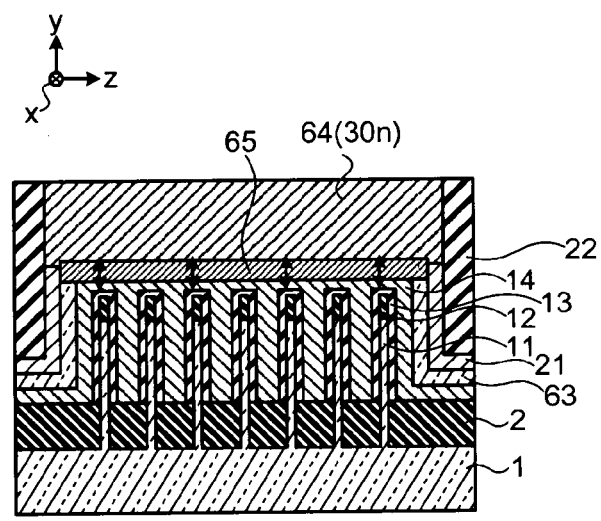

FIG. 6A to FIG. 6F are schematic cross-sectional views showing one example of a procedure of a method of manufacturing a semiconductor device according to a third embodiment of the present invention. As shown in FIG. 6F, this FinFET has the following configuration. The stress application layer 61 in the second embodiment is formed by a polycrystalline silicon film 63. The gate plug 30n is formed by a plug layer 64 made of a metal material forming an alloy with silicon. The polycrystalline silicon film 63 on the gate electrode 14 is configured by a silicide film 65 alloyed with a metal configuring the plug layer 64. The plug layer 64 configuring the gate plug 30n can be a conductive material having larger Young's modulus than that of the constituent material of the fins 11, as well as a metal material capable of forming silicide in reaction with silicon, like in the first and second embodiments. In the third embodiment, the silicide film 65 on the gate electrode 14 functions as a compressive-stress application layer giving compressive stress to the fins 11. Constituent elements identical with those of the FinFET in the first and second embodiments are denoted by like reference numerals, and explanations thereof will be omitted.

The method of manufacturing a semiconductor device according to the third embodiment is explained next. As explained with reference to FIGS. 4A and 4B in the first and second embodiments, after a fin structure is formed on the silicon substrate 1, the element-isolation insulating film 2 is embedded into between the fin structures, and predetermined conductive ion is implanted into the region in which the channel region of the fins 11 is formed.

Next, as shown in FIG. 6A, the gate insulating film 13, the gate electrode 14, and the polycrystalline silicon film 63 are formed on the silicon substrate 1 on which the fin structure is formed. In this case, the gate electrode 14 is formed to fill between the adjacent fin structures, and the polycrystalline silicon film 63 is formed to cover the whole upper surface of the formed gate electrode 14. Thereafter, a laminated film of the gate insulating film 13, the gate electrode 14, and the polycrystalline silicon film 63 is patterned in a predetermined shape, by the photolithographic technique and RIE. Predetermined conductive impurity is ion-implanted into both-side fins 11 of the gate electrode 14 along the x-axis direction of the fins 11 in the FinFET forming region, using the laminated film as a mask. The impurity is dissipated by heat treatment, thereby forming source and drain regions. Thereafter, as shown in FIG. 6B, the liner film 21 and the interlayer insulating film 22 are sequentially formed on the silicon substrate 1.

As shown in FIG. 6C, a photoresist 54 is coated onto the whole upper surface of the interlayer insulating film 22. After this, openings to form plugs are formed on the gate electrode 14, the source region, and the drain region of the FinFET forming region, using the photolithographic technique and RIE. In this example, because a cross section passing through the gate electrode 14 parallel with the extension direction of the gate electrode 14 is shown, a state of forming the opening 23 to form the gate plugs 30n is shown. In this case, the interlayer insulating film 22 is etched, using the liner film 21 as an etching stopper film, and the liner film 21 is also removed, thereby exposing the upper surface of the polycrystalline silicon film 63.

After the photoresist 54 is removed, a metal material film forming an alloy in reaction with silicon is formed as the plug layer 64, to fill the opening 23, using a sputtering method or the like, as shown in FIG. 6D. Thereafter, as shown in FIG. 6E, the polycrystalline silicon film 63 is reacted with the plug layer 64 within the opening 23 on the gate electrode 14, by heat treatment, thereby being formed the silicide film 65 on the gate electrode 14. The plug layer 64 unnecessarily formed on the interlayer insulating film 22 is removed by using CMP or the like, thereby forming the FinFET shown in FIG. 6F.

In this last heat treatment, the silicide film 65 formed by reacting the polycrystalline silicon film 63 with the plug layer 64 constituting the gate plug 30n expands more than the polycrystalline silicon film 63. As a result, the silicide film 65 functions as a compressive-stress application layer that applies compressive stress to the fins 11 in the y-axis direction. Nickel (Ni), cobalt (Co), and W can be used as metal materials to form an alloy with silicon used for the plug layer 64. When a metal material of which a difference between linear expansion coefficients at a temperature of heat treatment on W or the like and the room temperature is smaller than a difference between linear expansion coefficients of a material constituting the fins 11 at a temperature of the heat treatment and the room temperature, and which forms an alloy with silicon, is used for the plug layer 64, compressive stress corresponding to a difference between linear expansion coefficients of the stress application layer at the temperature of performing a heat treatment and the room temperature can be also applied to the fins 11 in the height direction (the y-axis direction) as explained in the first and second embodiments, in addition to the compressive stress generated by volume expansion by silicification. Therefore, compressive stress can be effectively applied to the fins 11. Because this method is the application of compressive stress to the fins 11, this method can be applied to only the nFinFET 10n. While a thickness of the silicide film 65 is determined by the thickness of the polycrystalline silicon film 63, this thickness can be appropriately selected depending on the size of the compressive stress applied to the fins 11. The gate plug 30n (the plug layer 64) can be configured by a one-layer conductive material or can be configured by plural conductive materials. When W is used for the plug layer 64, compressive stress can be more effectively applied to the fins 11, by configuring a lower layer of the plug layer 64 by W and by configuring an upper layer by a conductive material having larger Young's modulus than that of the material constituting the fins 11.

In the third embodiment, the polycrystalline silicon film 63 is formed on the gate electrode 14. The gate plug 30n (the plug layer 64) is formed by a metal material on this polycrystalline silicon film 63. The formed result is heat treated to silicify only the upper part of the gate electrode 14 of the polycrystalline silicon film 63, thereby forming the silicide film 65 having expanded volume. As a result, compressive stress can be applied to the fins 11 in the y-axis direction. Therefore, carrier mobility in the channel can be improved from that in the conventional nFinFET structure.

While in the above explanations, a multi-fin structure of collectively extracting current flowing through between the source and the drain obtained by plural fins 11 is explained, the embodiments can be also similarly applied to a FinFET of a single-fin structure in which one fin 11 operates as one FET. While the FinFET described above has a double-gate structure, the embodiments can be also similarly applied to a FinFET having a triple-gate structure.

According to the embodiments of the present invention, it is possible to further improve carrier mobility in the channel as compared with the carrier mobility in the semiconductor device having a conventional Fin structure. Further, according to the embodiments of the present invention, it is possible to manufacture semiconductor devices having further improved carrier mobility in the channel as compared with carrier mobility in semiconductor devices having a conventional Fin structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a first field-effect transistor formed on the semiconductor substrate, and including a fin constituted by a semiconductor layer having source and drain regions via a channel region in an extending direction, and a gate electrode formed on the channel region via an insulating film;
a stress application layer formed on a top surface of the gate electrode, and formed by a conductive material of which a difference between linear expansion coefficients at a temperature of forming a stress application layer and a room temperature is different from a difference between linear expansion coefficients of the fin at the temperature of forming the stress application layer and the room temperature, and
a plug layer formed on the stress application layer and above the fin, and made of a conductive material having larger Young's modulus than that of the fin.

2. The semiconductor device according to claim 1, wherein the fin forms an n-type channel, and
the stress application layer is configured by a material of which a difference between linear expansion coefficients at the temperature of forming the stress application layer and the room temperature is smaller than a difference between linear expansion coefficients of the fin at the temperature of forming the stress application layer and the room temperature.

3. The semiconductor device according to claim 2, wherein the stress application layer is configured by at least one of elements W and Ir.

4. The semiconductor device according to claim 1, wherein the fin forms an p-type channel, and
the stress application layer is configured by a material of which a difference between linear expansion coefficients at the temperature of forming the stress application layer and the room temperature is larger than a difference between linear expansion coefficients of the fin at the temperature of forming the stress application layer and the room temperature.

5. The semiconductor device according to claim 4, wherein the stress application layer is configured by at least one of elements selected from a group of Mg, Al, Cu, and Ag.

6. The semiconductor device according to claim 2, further comprising a second field-effect transistor formed on the semiconductor substrate, and including fin constituted by a semiconductor layer having source and drain regions via a channel region in an extension direction, and a gate electrode formed on the channel region via an insulating film, wherein
the fin of the second field-effect transistor forms a p-type channel,
a stress application layer of the second field-effect transistor is configured by a material of which a difference between linear expansion coefficients at a temperature of forming the stress application layer of the second field-effect transistor and the room temperature is larger than a difference between linear expansion coefficients of the fin at a temperature of forming the stress application layer of the second field-effect transistor and the room temperature, and
the plug layer of the first field-effect transistor and the second field-effect transistor are constituted of the same material.

7. The semiconductor device according to claim 1, wherein the field-effect transistor further includes a cap film made of an insulating material between the upper part of the fin and the insulating film.

8. The semiconductor device according to claim 1, wherein the field-effect transistor has a structure having the source region, the drain region, and the gate electrode of a plurality of fins laid out in a direction to orthogonal with the extending direction, connected to each other by common wirings.

9. A semiconductor device comprising:
a semiconductor substrate;
a first field-effect transistor formed on the semiconductor substrate, and including a fin constituted by a semiconductor layer having source and drain regions via a channel region in an extending direction, and a gate electrode formed on the channel region via an insulating film;
a stress application layer formed on a top surface of the gate electrode, and made of a silicide film that applies stress to the fin in a height direction, and
a plug layer formed on the stress application layer and above the fin, and made of a conductive material having larger Young's modulus than that of the fin.

10. The semiconductor device according to claim 9, wherein Young's modulus of the plug layer is larger than Young's modulus of the stress application layer.

11. The semiconductor device according to claim 9, wherein the conductive material is configured by at least one of elements selected from a group of Ni, Co, and W.

12. The semiconductor device according to claim 9, wherein the stress application layer is a silicide film formed by reacting a silicon film formed on the gate electrode with the plug layer.

13. The semiconductor device according to claim 9, wherein the plug layer is configured by at least one of materials WC and TaC.

14. The semiconductor device according to claim 9, wherein the field-effect transistor further includes a cap film made of an insulating material between the upper part of the fin and the insulating film.

15. The semiconductor device according to claim 9, wherein the field-effect transistor has a structure having the source region, the drain region, and the gate electrode of a plurality of fins laid out in a direction to orthogonal with the extending direction, connected to each other by common wirings.

* * * * *